US008859382B2

(12) United States Patent
Rocklein et al.

(10) Patent No.: US 8,859,382 B2
(45) Date of Patent: Oct. 14, 2014

(54) METHODS OF FORMING METAL OXIDE AND MEMORY CELLS

(75) Inventors: Noel Rocklein, Boise, ID (US); D. V. Nirmal Ramaswamy, Boise, ID (US); Dale W. Collins, Boise, ID (US); Swapnil Lengade, Boise, ID (US); Srividya Krishnamurthy, Boise, ID (US); Mark Korber, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/282,355

(22) Filed: Oct. 26, 2011

(65) Prior Publication Data
US 2013/0109147 A1 May 2, 2013

(51) Int. Cl.
*H01L 21/20* (2006.01)
*H01L 45/00* (2006.01)

(52) U.S. Cl.
CPC ............ *H01L 45/08* (2013.01); *H01L 45/1233* (2013.01); *H01L 45/147* (2013.01); *H01L 45/145* (2013.01); *H01L 45/146* (2013.01); *H01L 45/1641* (2013.01)
USPC ........................................................ 438/381

(58) Field of Classification Search
CPC ..................... H01L 29/7869; H01L 21/02565; H01L 29/26; H01L 45/146; H01L 21/02617
USPC ........................................................... 438/381
See application file for complete search history.

(56) References Cited

U.S. PATENT DOCUMENTS

| | | | |
|---|---|---|---|
| 6,774,054 B1 | 8/2004 | Zhang et al. | |
| 6,911,361 B2 | 6/2005 | Zhang et al. | |
| 7,309,616 B2 | 12/2007 | Nagashima et al. | |
| 7,402,456 B2 | 7/2008 | Zhuang et al. | |
| 2005/0270821 A1 | 12/2005 | Nakano | |
| 2012/0014159 A1* | 1/2012 | Song | 365/145 |
| 2012/0088360 A1* | 4/2012 | Kim et al. | 438/592 |

* cited by examiner

*Primary Examiner* — Tony Tran
(74) *Attorney, Agent, or Firm* — Wells St. John P.S.

(57) ABSTRACT

Some embodiments include methods of forming memory cells. Metal oxide may be deposited over a first electrode, with the deposited metal oxide having a relatively low degree of crystallinity. The degree of crystallinity within the metal oxide may be increased after the deposition of the metal oxide. A dielectric material may be formed over the metal oxide, and a second electrode may be formed over the dielectric material. The degree of crystallinity may be increased with a thermal treatment. The thermal treatment may be conducted before, during, and/or after formation of the dielectric material.

28 Claims, 3 Drawing Sheets

US 8,859,382 B2

METHODS OF FORMING METAL OXIDE AND MEMORY CELLS

TECHNICAL FIELD

Methods of forming metal oxide and memory cells.

BACKGROUND

Memory is one type of integrated circuitry, and may be used in computer systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

There is a developing interest in memory cells which have programmable material provided between a pair of electrically conductive electrodes. Such memory cells may be referred to as cross-point memory cells.

Programmable materials suitable for utilization in cross-point memory will have two or more selectable and electrically differentiable memory states. The multiple selectable memory states can enable storing of information by an individual memory cell. The reading of the cell comprises determination of which of the memory states the programmable material is in, and the writing of information to the cell comprises placing the programmable material in a predetermined memory state.

Some memory cells utilize multiple discrete materials between the electrodes to create the programmable material. Such memory cells may be programmed by moving oxygen species (for instance, oxygen ions) within and/or between the materials. Memory devices that utilize migration of mobile charge carriers to transition from one memory state to another are sometimes referred to as Resistive Random Access Memory (RRAM) cells.

At least one of the materials utilized in such RRAM may be a conductive metal oxide (for instance, a combination of Pr, Ca, Mn and O; which is commonly referred to as PCMO). It can be difficult to consistently form metal oxide having uniform desired characteristics (for instance, high conductivity) across an array of memory cells. Accordingly, it is desired to develop new methods for forming conductive metal oxide within RRAM cells.

DETAILED DESCRIPTION OF THE ILLUSTRATED EMBODIMENTS

Metal oxides (such as, for example, PCMO) may have amorphous and crystalline states. The crystalline states may have improved electrical properties for utilization in RRAM relative to the amorphous states; and may, for example, have lower resistance, improved oxygen ion migration, etc. Conventional methods deposit conductive metal oxide in crystalline form during fabrication of RRAM. However, such methods are slow (with deposition rates typically being less than or equal to about 0.3 Å/second), and thus negatively impact desired throughput of a fabrication process.

Some embodiments include recognition that various metal oxides may be transformed from an amorphous form into a crystalline form by reducing the oxygen content of the metal oxides. Thus, metal oxides may be deposited in an amorphous form at a relatively high deposition rate (for instance, greater than or equal to about 2 Å/second), and then converted into crystalline form by reducing the oxygen content of the metal oxides. A possible mechanism relative to PCMO is that a higher oxidation of manganese promotes an amorphous phase with higher resistance, while a lower oxidation of manganese promotes a crystalline phase with lower resistance. The terms "higher oxidation" and "lower oxidation" are relative to one another, rather than having meaning relative to an external scale. Thus, the "higher oxidation" is a higher oxidation then the "lower oxidation," and may or may not correspond to one of the highest oxidation states of manganese. Similarly, the terms "higher resistance" and "lower resistance" are relative to one another rather than having meaning relative to external scale. Thus, the "lower resistance" is a lower resistance than the "higher resistance," and may or may not correspond to a lowest resistance state of the metal oxide.

The oxygen content within the metal oxide may be reduced with any suitable method. In some embodiments, the oxygen content of the metal oxide may be reduced by maintaining the metal oxide at a temperature of at least about 600° C. for a duration of at least about 5 minutes while exposing the metal oxide to an environment which is either inert relative to reaction with all constituents of the metal oxide, or reducing relative to reaction with one or more constituents of the metal oxide. Example embodiments are discussed below with reference to FIGS. 1-9.

Figure 1:
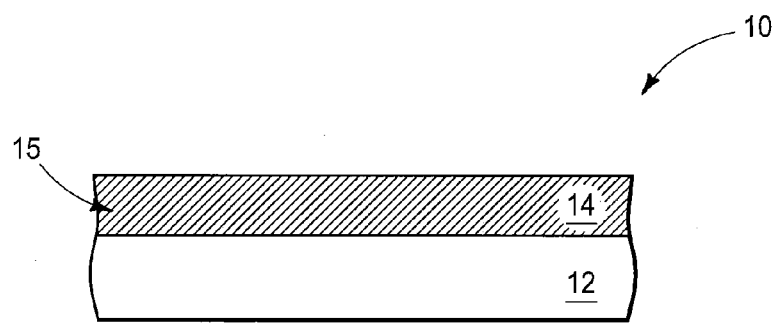
FIGS. 1-5 are diagrammatic cross-sectional views of a portion of a construction at various stages of an example embodiment process of forming a memory cell.

Referring to FIG. 1, a construction 10 is shown to comprise an electrode material 14 over a base 12.

The base 12 may be a semiconductor base; and may comprise, consist essentially of or consist of monocrystalline silicon. If the base comprises semiconductor material, it may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 12 is shown to be homogenous, the base may comprise numerous materials in some embodiments. For instance, base 12 may correspond to a semiconductor substrate containing one or more materials associated with integrated circuit fabrication. In such embodiments, such materials may correspond to one or more of refractory metal materials, barrier materials, diffusion materials, insulator materials, etc.

The electrode material 14 may comprise any suitable electrically conductive composition or combination of compositions; and in some embodiments may comprise, consist essentially of, or consist of platinum. The electrode material may be formed to any suitable thickness, and in some embodiments may be formed to a thickness of at least about 1000 angstroms (such as, for example, a thickness of about 2000 angstroms). The electrode material 14 forms a first electrode 15.

Figure 2:
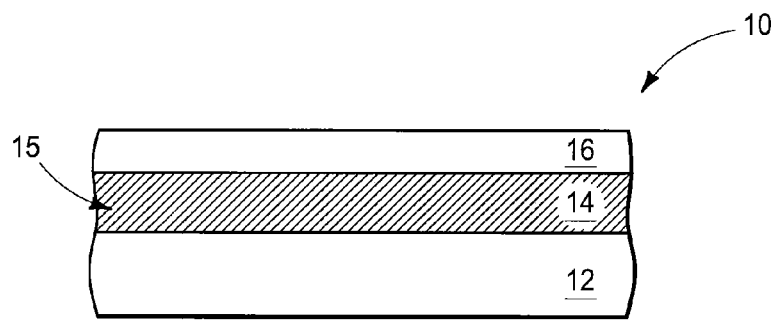

Referring to FIG. 2, metal oxide 16 is deposited over the first electrode 15. The metal oxide may comprise any suitable composition or combination of compositions; and in some embodiments may comprise, consist essentially of, or consist of oxygen in combination with one or more of praseodymium, barium, calcium, manganese, strontium, titanium, iron, cesium and lead. For instance, the metal oxide may comprise, consist essentially of, or consist of PCMO; or more specifically may comprise, consist essentially of, or consist of PrCaMnO, where the listed composition is described in terms of principle components rather than in terms of a specific stoichiometry.

The deposition of the metal oxide may utilize any suitable methodology, including, for example, one or more of physical vapor deposition (PVD), atomic layer deposition (ALD) and chemical vapor deposition (CVD).

The metal oxide 16 is deposited with a relatively low degree of crystallinity (with the term "relatively low" indicating that the crystallinity is low relative to another degree of crystallinity that will ultimately be induced at a subsequent processing stage), and in some embodiments the deposited metal oxide may be entirely amorphous. The metal oxide 16 may be considered to be a low degree of crystallinity form of the metal oxide.

Figure 3:
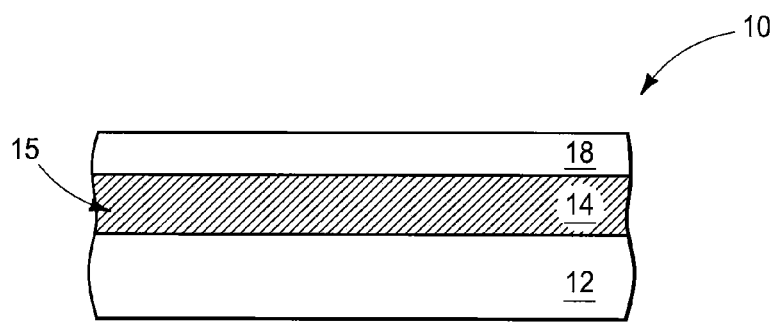

Referring to FIG. 3, the metal oxide is subjected to treatment which increases the degree of crystallinity of the metal oxide and thus transforms the metal oxide into a metal oxide 18 having a high degree of crystallinity. The metal oxide 18 has a higher degree of crystallinity than the metal oxide 16 (FIG. 2), and in some embodiments the metal oxide 18 may be entirely crystalline. The high degree of crystallinity form of the metal oxide may have increased electrical conductivity (i.e., lowered electrical resistance) relative to the low degree of crystallinity form of the metal oxide, and in some embodiments the metal oxide 18 may be electrically conductive while the metal oxide 16 is not.

The processing utilized to increase the degree of crystallinity of the metal oxide in transitioning from the process stage of FIG. 2 to that of FIG. 3 may comprise a thermal treatment of the metal oxide coupled with exposure of the metal oxide to an environment which is either inert relative to reaction with all constituents of the metal oxide or reducing relative to reaction with one or more constituents of the metal oxide.

The thermal treatment may comprise an anneal that maintains a temperature of the metal oxide at a temperature of at least about 600° C. for a duration of several minutes (for instance, a duration of at least about 5 minutes).

If a reducing environment is utilized during such anneal, the environment may comprise $H_2$. The $H_2$ may increase crystallinity within the metal oxide by, for example, reacting with oxygen to form water and thus drive an equilibrium toward depletion of oxygen from the metal oxide. Additionally, or alternatively, the hydrogen may stabilize a lower oxidation state of the metal oxide by interacting with dangling bonds to chemically passivate the dangling bonds.

If an inert environment is utilized during the anneal of the metal oxide, the environment may comprise, consist essentially of, or consist of $N_2$, argon, and/or other gases which are inert relative to reaction with all constituents of the metal oxide at the temperatures utilized during the thermal treatment.

The metal oxide 18 may be formed to any suitable thickness; and in some embodiments may be formed to a thickness greater than or equal to about 50 Å, such as, for example, a thickness of about 350 Å.

Figure 4:
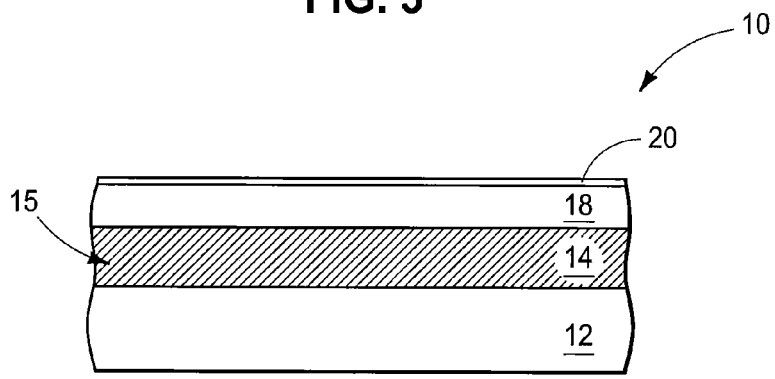

Referring to FIG. 4, dielectric material 20 can be deposited over metal oxide 18. The deposition may comprise any suitable methodology, including for example, one or both of ALD and CVD.

The dielectric material may comprise any suitable composition or combination of compositions; and in some embodiments may comprise one or more of metal oxide, silicon dioxide and silicon nitride. If the dielectric material 20 comprises metal oxide, the dielectric material may be referred to as a second metal oxide to distinguish it from the first metal oxide 18. In some embodiments, dielectric material 20 may comprise, consist essentially of, or consist of one or both of hafnium oxide and zirconium oxide. In such embodiments, the oxide of dielectric material 20 may be formed utilizing a relatively mild oxidant (such as, for example, water) in order to avoid inadvertently oxidizing the conductive metal oxide 18. For instance, in some embodiments the dielectric material 20 may consist of one or both of hafnium oxide and zirconium oxide, and may be formed utilizing water as the only source of oxygen within the dielectric material.

The dielectric material 20 may be formed to any suitable thickness, and in some embodiments may be formed to a thickness of less than or equal to about 50 Å; such as, for example, a thickness of less than or equal to about 30 Å.

Figure 5:
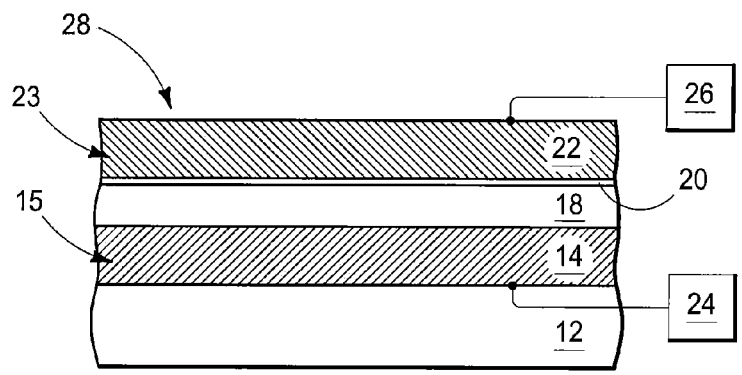

Referring to FIG. 5, electrode material 22 is formed over dielectric material 20. The electrode material 22 may comprise any suitable composition or combination of compositions, and may comprise an identical composition as electrode material 14 or a different composition from electrode material 14. In some embodiments, electrode material 22 may comprise, consist essentially of, or consist of platinum, either alone, or in combination with metal silicide (for instance, tungsten silicide).

The electrode material 22 forms an electrode 23. In some embodiments, the electrodes 15 and 23 may be referred to as a first electrode and a second electrode, respectively, to distinguish such electrodes from one another.

The electrodes 15 and 23, together with the materials 18 and 20, form a memory cell 28.

The electrode 15 is shown connected to circuitry 24, and the electrode 22 is shown connected to circuitry 26. In operation, the circuitries 24 and 26 are utilized to provide voltage between the electrodes 15 and 23. The voltage may be utilized for erasing the memory cell, programming the memory cell and/or for determining resistance across the memory cell and thereby reading a memory state of the memory cell.

The memory cell 28 is an RRAM cell. Such RRAM cell may be programmed by moving oxygen species (for instance, oxygen ions) within and/or between the materials 18 and 20. For instance, if the dielectric material 20 comprises a metal oxide, such dielectric material may be referred to as an inter-metal oxide (IMO), and programming of the RRAM cell may comprise oxygen diffusion from the conductive metal oxide 18 into the IMO (and possibly to an interface of the IMO with the second electrode 23) under an appropriate voltage.

Figure 6:
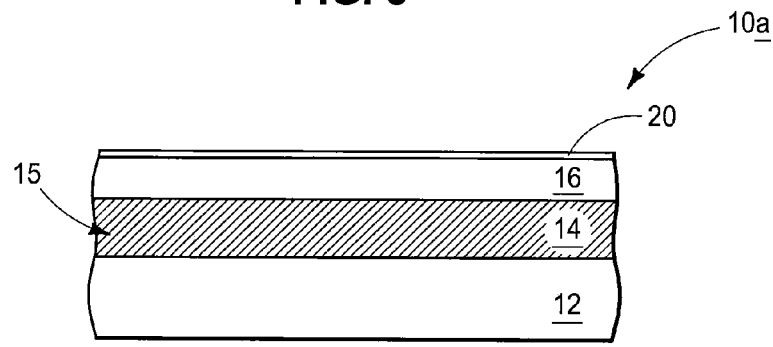
FIGS. 6-8 are diagrammatic cross-sectional views of a portion of a construction at various stages of another example embodiment process of forming a memory cell. The process stage of FIG. 6 follows that of FIG. 2.
Figure 7:
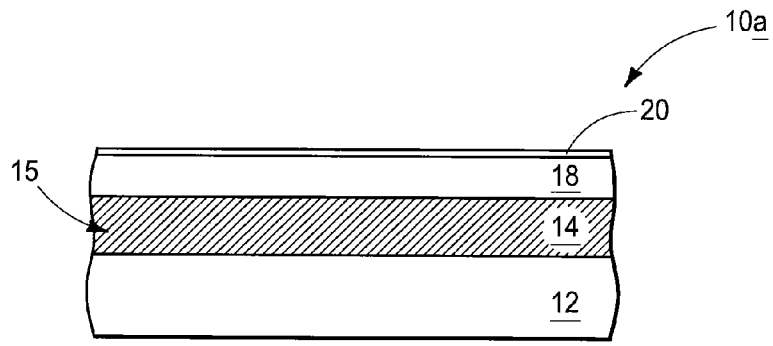
Figure 8:
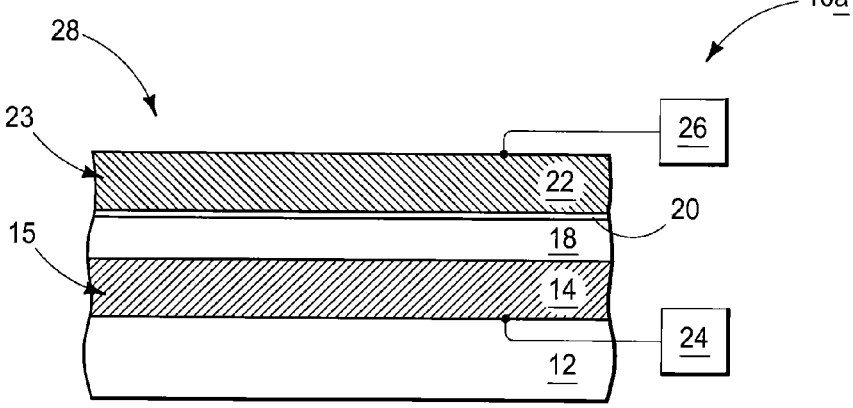

The processing of FIGS. 1-5 converts metal oxide from the low degree of crystallinity form of the metal oxide (the metal oxide 16 of FIG. 2) to the high degree of crystallinity form of the metal oxide (the metal oxide 18 of FIG. 3) prior to deposition of the dielectric material 20 (FIG. 4). In other embodiments, such conversion from the low degree of crystallinity form to the high degree of crystallinity form may occur, at least in part, during and/or after formation of the dielectric material 20. FIGS. 6-8 illustrate an example process in which the conversion from the low degree of crystallinity form to the high degree of crystallinity form occurs after formation of the dielectric material. Similar numbering will be utilized to describe FIGS. 6-8 as is utilized above to describe FIGS. 1-5, where appropriate.

Referring to FIG. 6, a construction 10a is shown at a processing stage subsequent to that of FIG. 2. The construction 10a comprises the dielectric material 20 formed over the low degree of crystallinity form of the metal oxide (i.e., the metal oxide 16).

Referring to FIG. 7, the construction 10a is shown after it has been subjected to processing suitable to convert the metal oxide from the low degree of crystallinity form of the metal oxide (the metal oxide 16 of FIG. 6) to a high degree of crystallinity form of the metal oxide (the metal oxide 18 of FIG. 7). Such processing may be analogous to the processing discussed above with reference to FIG. 3. The dielectric material 20 utilized in the processing of FIGS. 6 and 7 should be thin enough and of suitable composition so that oxygen may migrate out of the underlying metal oxide and either into or through the dielectric material 20 so that the metal oxide may be converted from the low degree of crystallinity form to the high degree of crystallinity form. In some embodiments, dielectric material 20 may have a thickness of less than or equal to about 50 Å; such as, for example, a thickness of less than or equal to about 30 Å.

An advantage of the processing of FIGS. 6 and 7 may be that the dielectric material 20 can be formed utilizing a more aggressive oxidant than can be utilized during above-discussed process stage of FIG. 4. Specifically, since the process stage of FIG. 4 followed the removal of oxygen from the metal oxide to convert the metal oxide from the low degree of crystallinity form to the high degree of crystallinity form, the dielectric material 20 was formed under conditions which would not re-introduce oxygen into the metal oxide 18. In contrast, the processing of FIGS. 6 and 7 converts the metal oxide from the low degree of crystallinity form to the high degree of crystallinity form after formation of the dielectric material. Thus, it may not be problematic for oxygen to be introduced into the metal oxide during formation of the dielectric material since such oxygen can be subsequently removed after formation of the dielectric material. Accordingly, ozone or other aggressive oxidant may be utilized during formation of the dielectric material 20 shown at the processing stage of FIG. 6. For instance, dielectric material 20 may comprise hafnium oxide and/or zirconium oxide formed utilizing ozone as the source of oxygen within such dielectric material.

FIG. 8 shows construction 10 at a processing stage analogous to that discussed above with reference to FIG. 5, and shows that the various materials may be incorporated into an RRAM cell 28 identical to that discussed above with reference to FIG. 5.

Various embodiments may comprise one or more process stages utilized to remove oxygen from metal oxide to increase crystallinity and/or decrease electrical resistance within the metal oxide, and such process stages may occur before, during and/or after formation of dielectric material over the metal oxide. Thus, the processing discussed above with reference to FIGS. 1-5 may be utilized in combination with the processing discussed with reference to FIGS. 6-8 in some embodiments.

Figure 9:
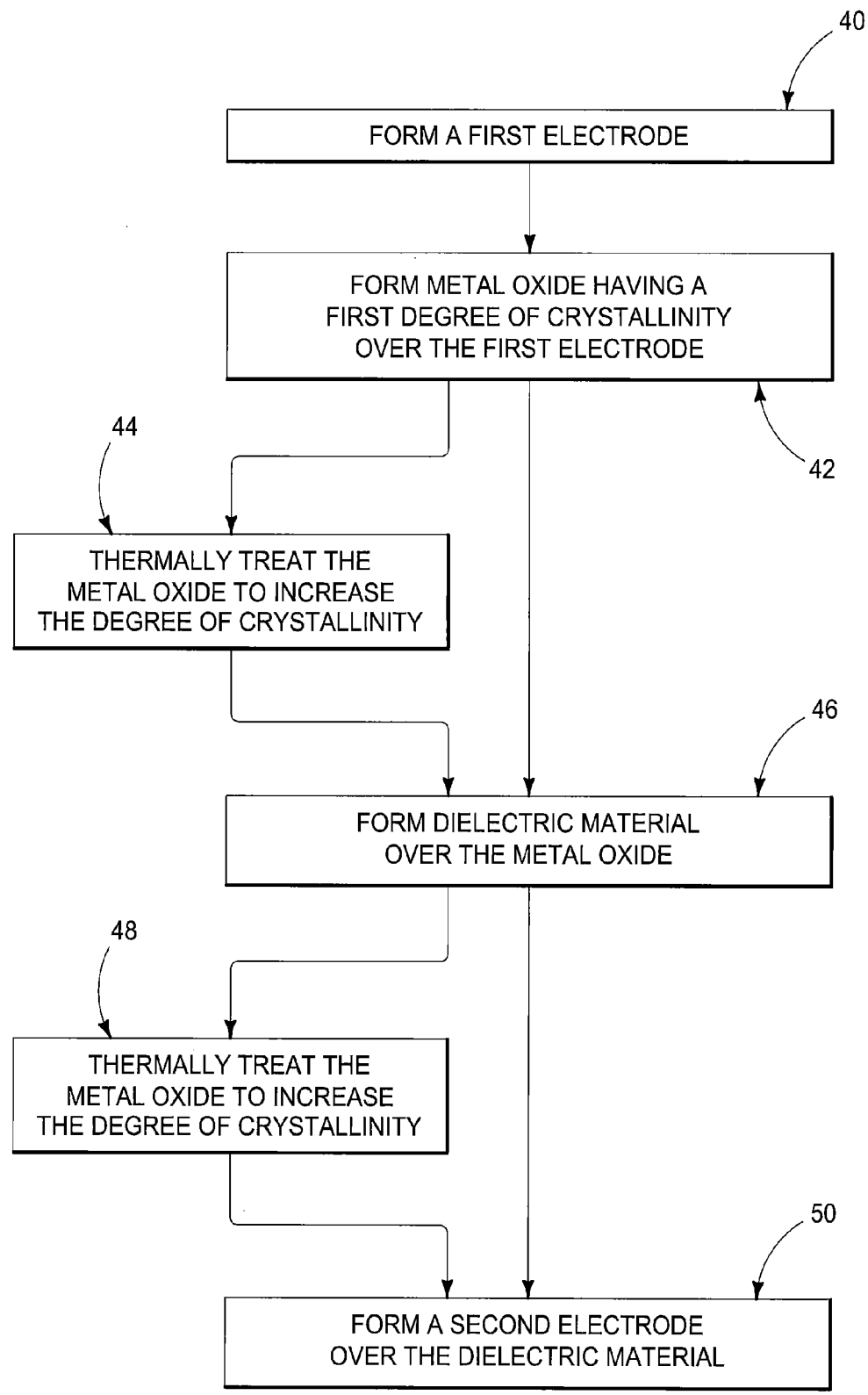
FIG. 9 is a flow chart diagram illustrating process flows of some example embodiments.

FIG. 9 shows a flowchart illustrating some process sequences that may be utilized in some embodiments.

At an initial stage 40, a first electrode is formed. Such electrode may be analogous to the electrode 15 of FIG. 1.

At a subsequent stage 42, metal oxide is formed over the first electrode, with the metal oxide having a first degree of crystallinity. Such metal oxide may be analogous to the metal oxide 16 shown in FIG. 2.

The metal oxide may then be thermally treated as shown at stage 44 to increase the degree of crystallinity, and dielectric material may be formed over the metal oxide as shown at stage 46. The metal oxide having the increased crystallinity may be analogous to the oxide 18 of FIG. 3, and the dielectric material may be analogous to the dielectric material 20 of FIG. 4.

After the dielectric material is formed, the metal oxide may be thermally treated to increase the degree of crystallinity as shown at the stage 48, and the second electrode may be formed over the dielectric material as shown at a stage 50. The second electrode may be analogous to the electrode 23 of FIG. 5.

The flowchart of FIG. 9 shows that some embodiments thermally treat the metal oxide prior to forming the dielectric material (i.e., flow to stage 44 and then to stage 46), while other embodiments form the dielectric material without first thermally treating the metal oxide (i.e., flow directly from stage 42 to stage 46). The flowchart of FIG. 9 also shows that some embodiments thermally treat the metal oxide after forming the dielectric (i.e., flow from stage 46 to stage 48), while other embodiments form the second electrode over the dielectric material immediately after forming the dielectric material (i.e., flow from stage 46 directly to stage 50). Thus, the invention includes embodiments in which metal oxide is thermally treated only prior to forming dielectric material, embodiments in which metal oxide is thermally treated only after forming dielectric material, and embodiments in which metal oxide is thermally treated both prior to forming dielectric material and after forming dielectric material. Further, the invention includes embodiments in which the metal oxide is thermally treated during formation of the dielectric material (not shown in FIG. 9).

RRAM cells formed in accordance with the methods discussed above may be incorporated into memory arrays or other integrated circuitry. Such integrated circuitry may be incorporated into electronic systems. Such electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of increasing crystallinity within a metal oxide. The method includes annealing the metal oxide at a temperature of at least about 600° C. while exposing the metal oxide to an environment which is either inert relative to reaction with all constituents of the metal oxide, or reducing relative to reaction with one or more constituents of the metal oxide. The metal oxide is electrically conductive after the anneal.

Some embodiments include a method of forming an electrically conductive metal oxide. Metal oxide is deposited over an underlying material. After the metal oxide is deposited, crystallinity of the metal oxide is increased by annealing the metal oxide at a temperature of at least about 600° C. while exposing the metal oxide to an environment which is reducing relative to reaction with one or more constituents of the metal oxide.

Some embodiments include a method of forming a memory cell. Metal oxide is deposited over a first electrode, with the deposited metal oxide having a relatively low degree of crystallinity. After the metal oxide is deposited, the degree of crystallinity within the metal oxide is increased. The metal oxide having the increased degree of crystallinity is electrically conductive. A dielectric material is formed over the metal oxide, and a second electrode is formed over the dielectric material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a memory cell, comprising:
    depositing metal oxide over a first electrode, the deposited metal oxide having a relatively low degree of crystallinity;
    after the depositing, increasing the degree of crystallinity within the metal oxide by performing at least two thermal treatments of the metal oxide, each thermal treatment increasing the degree of crystallinity and increasing the electrical conductivity of the metal oxide;
    forming a dielectric material over the metal oxide; and
    forming a second electrode over the dielectric material;
    wherein the metal oxide is a first metal oxide, and wherein the dielectric material comprises a second metal oxide, and wherein the formation of the dielectric material utilizes water as the only source of oxygen for the second metal oxide; and
    wherein the second metal oxide consists of both of hafnium oxide and zirconium oxide.

2. The method of claim 1 wherein the increasing of the degree of crystallinity comprises at least one of the at least two thermal treatments of the metal oxide conducted prior to formation of the dielectric material.

3. The method of claim 1 wherein the increasing the degree of crystallinity comprises at least one of the at least two thermal treatments of the metal oxide conducted after formation of the dielectric material.

4. The method of claim 1 wherein the increasing the degree of crystallinity comprises at least one of the at least two thermal treatments of the metal oxide conducted during formation of the dielectric material.

5. The method of claim 1 wherein the increasing of the degree of crystallinity and the performing the at least two thermal treatments comprise:
    a first thermal treatment of the metal oxide conducted prior to formation of the dielectric material; and
    a second thermal treatment of the metal oxide conducted during and/or after formation of the dielectric material.

6. The method of claim 5 wherein the first and second thermal treatments each comprise maintaining the metal oxide at a temperature of at least about 600° C. for a duration of at least about 5 minutes.

7. The method of claim 1 wherein the deposited metal oxide is entirely amorphous.

8. The method of claim 1 wherein the metal oxide comprises oxygen in combination with one or more of barium, cesium and lead.

9. The method of claim 1 wherein the metal oxide is a first metal oxide, and wherein the dielectric material comprises one or more of a second metal oxide, silicon dioxide and silicon nitride.

10. The method of claim 1 wherein the dielectric material is formed to a thickness of less than or equal to about 50 Å.

11. The method of claim 1 wherein the first metal oxide is a separate and discrete layer relative the second metal oxide.

12. The method of claim 1 wherein the first metal oxide is formed to a thickness of greater than or equal to about 50 angstroms or to about 350 angstroms.

13. The method of claim 1 wherein the forming of the dielectric material comprises depositing the dielectric material.

14. The method of claim 1 wherein all of the chemical elements of the dielectric material is different from all the chemical elements of the metal oxide.

15. The method of claim 1 wherein the dielectric material comprises silicon dioxide and silicon nitride.

16. The method of claim 1 wherein the depositing comprises performing an atomic layer deposition (ALD).

17. The method of claim 1 wherein the forming of the dielectric material comprises performing an atomic layer deposition (ALD).

18. The method of claim 1 wherein the forming of the dielectric material comprises utilizing water.

19. The method of claim 1 wherein the dielectric material comprises an inter-metal oxide (IMO).

20. The method of claim 1 wherein the forming of the dielectric material comprises utilizing ozone.

21. The method of claim 1 wherein the depositing of the metal oxide comprises depositing at a rate of greater than or equal to about 2 Å/second.

22. The method of claim 1 wherein the at least two thermal treatments comprises a second thermal treatment that is performed in an environment which is either inert relative to a reaction with all constituents of the metal oxide or reducing relative to a reaction with one or more constituents of the metal oxide.

23. The method of claim 1 wherein the dielectric material is formed to a thickness of less than or equal to about 30 Å.

24. A method of forming a memory cell, comprising:
    depositing metal oxide layer over a first electrode, the deposited metal oxide layer having a relatively low degree of crystallinity;
    forming a dielectric layer over the metal oxide layer, the dielectric layer comprising a separate and discrete layer from the metal oxide layer;

performing a thermal treatment of the metal oxide layer to increase the degree of crystallinity and to increase the electrical conductivity of the metal oxide layer, the performing of the thermal treatment conducted during and/or after the forming of the dielectric layer; and forming a second electrode over the dielectric layer;

wherein the metal oxide is a first metal oxide, and wherein the dielectric material comprises a second metal oxide, and wherein the formation of the dielectric material utilizes water as the only source of oxygen for the second metal oxide; and wherein the second metal oxide consists of both of hafnium oxide and zirconium oxide.

25. The method of claim 24 wherein the depositing of the metal oxide layer comprises depositing at a rate of greater than or equal to about 2 Å/second.

26. The method of claim 24 wherein the thermal treatment is a second thermal treatment of at least two thermal treatments, the second thermal treatment is performed in an environment which is either inert relative to a reaction with all constituents of the metal oxide layer or reducing relative to a reaction with one or more constituents of the metal oxide layer.

27. The method of claim 24 wherein the dielectric layer is formed to a thickness of less than or equal to about 50 Å.

28. The method of claim 24 wherein the metal oxide layer is formed to a thickness of greater than or equal to about 50 angstroms or to about 350 angstroms.

* * * * *